(12) United States Patent
Eguchi et al.

(10) Patent No.: US 6,586,105 B2
(45) Date of Patent: Jul. 1, 2003

(54) PACKAGING STRUCTURE AND METHOD FOR AUTOMOTIVE COMPONENTS

(75) Inventors: Shuji Eguchi, Tokai-mura (JP); Masahiko Asano, Mito (JP); Mutsumi Watanabe, Hitachinaka (JP); Kunito Nakatsuru, Mito (JP); Hiroatsu Tokuda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/823,976

(22) Filed: Apr. 3, 2001

(65) Prior Publication Data

US 2002/0031672 A1 Mar. 14, 2002

(30) Foreign Application Priority Data

Sep. 4, 2000 (JP) ........................................ 2000-267785

(51) Int. Cl.$^7$ ................................................ B32B 27/06
(52) U.S. Cl. ........................ 428/447; 428/901; 438/127; 156/329; 174/52.2; 257/791
(58) Field of Search ................................. 428/447, 901; 427/96; 438/127; 174/52.2; 257/791; 156/329

(56) References Cited

U.S. PATENT DOCUMENTS

| 5,260,913 A | * | 11/1993 | Kadota et al. | ............... 367/140 |
| 5,357,673 A | * | 10/1994 | Polak et al. | ................... 29/840 |
| 5,547,730 A | | 8/1996 | Weiblen et al. | |
| 6,344,706 B1 | * | 2/2002 | Morita et al. | ............... 310/340 |

FOREIGN PATENT DOCUMENTS

| JP | 05-291590 | 11/1993 |
| JP | 07-324165 | 12/1995 |

* cited by examiner

Primary Examiner—Robert Dawson
Assistant Examiner—Christopher M. Keehan
(74) Attorney, Agent, or Firm—Dickstein Shapiro Morin & Oshinsky, LLP (57) ABSTRACT

The invention provides a packaging structure applied to an automotive component having semiconductors and electronic parts mounted on a ceramic base, characterized in that the semiconductors and electronic parts are partly or entirely sealed with a thixotropic silicone gel which has a thixotropy index of about 1.5–3.6 and a penetration depth of about 6–10 mm and a rate of change in viscosity of less than 10% of the initial value.

14 Claims, 6 Drawing Sheets

13 SENSOR CHIP   14 DIAPHRAM
12 GLASS BASE

FIG. 2(b)

8 EXTERNAL TERMINAL
15 RESIN CASE

FIG. 2(c)

16 METAL WIRE

FIG. 2(d)

10 THIXOTROPIC SILICONE GEL

FIG. 2(e)

17 PRESSURE PORT   11 CAP

TABLE 1

| CHARACTERISTIC PROPERTIES | | | DESIGNATION OF SILICONE GEL | | | | | | | | |
|---|---|---|---|---|---|---|---|---|---|---|---|
| | ITEMS | UNIT | A | B | C | D | E | F | G | H | I |
| BEFORE HARDENING | THIXOTROPY INDEX | | 2.1 | 1.9 | 2.3 | 3.6 | 3.7 | 1.4 | 1 | 3.6 | 3.3 |
| | VISCOSITY (25°C) | mPa·s | 2800 | 2300 | 3300 | 3000 | 6600 | 1750 | 690 | 3300 | 5300 |
| | DSC PEAK TEMPERATURE | °C | 122 | 125 | 123 | 120 | 123 | 131 | 105 | 98 | 128 |
| | STORAGE STABILITY, AT 25°C | MONTHS | 2.5 | 3 | 3 | (72h) | 2.5 | 3 | >3 | (4h) | 1 |
| | STORAGE STABILITY, AT 40°C | HOURS | >168 | >168 | >168 | 10 | >168 | >168 | >168 | 2 | 120 |
| | TYPE | | ONE-PACK | ONE-PACK | ONE-PACK | TWO-PACK | ONE-PACK | ONE-PACK | ONE-PACK | TWO-PACK | ONE-PACK |
| AFTER HARDENING | RATE OF PENETRATION, AT 25°C | | 95 | 85 | 85 | 82 | 90 | 82 | 89 | 85 | 50 |
| | RATE OF PENETRATION, AT -55°C | | 75 | 73 | 70 | 60 | 63 | 60 | 86 | 62 | 30 |
| | CLARITY, TOTAL LIGHT TRANSMITTANCE, % | | 85 | 86 | 82 | 75 | 76 | 85 | 90 | 70 | 50 |
| | VISUAL, 2mm THICK | | CLEAR | CLEAR | CLEAR | CLEAR | CLEAR | CLEAR | CLEAR | CLEAR | TRANSLUCENT |

TABLE 2

| ITEM | | | EXAMPLE | | | | | COMPARATIVE EXAMPLE | | | | |
|---|---|---|---|---|---|---|---|---|---|---|---|---|
| | | | 1 | 2 | 3 | 4 | 5 | 1 | 2 | 3 | 4 | 5 |
| COATING PERFORMANCE | WORKABILITY | | GOOD | GOOD | GOOD | POOR(*1) | GOOD | POOR(*2) | POOR(*3) | POOR(*3) | POOR(*1) | POOR(*2) |
| | APPEARANCE AFTER HARDENING | | GOOD | GOOD | GOOD | GOOD | GOOD | POOR(*4) | POOR(*5) | POOR(*5) | POOR(*6) | POOR(*4) |
| RELIABILITY | TEMPERATURE CYCLE TEST | NO. OF DEFECTIVES AFTER 1000 CYCLES (-55°C ↔ 150°C) | 0/5 | 0/5 | 0/5 | 0/5 | 0/5 | 0/5 | 0/5 | 0/5 | 0/5 | 0/5 |
| | HIGH-TEMPERATURE HIGH-HUMIDITY TEST | NO. OF DEFECTIVES AFTER 1000 HOURS AT 85°C, 85%RH | 0/5 | 0/5 | 0/5 | 0/5 | 0/5 | 2/5 | 1/5 | 1/5 | 0/5 | 1/5 |
| | PCT TEST (AT 121°C, SATURATED VAPOR PRESSURE) | NO. OF DEFECTIVES AFTER 96 HOURS | 0/5 | 0/5 | 0/5 | 0/5 | 0/5 | 3/5 | 1/5 | 1/5 | 1/5 | 1/5 |

FIG. 10

TABLE 3

| ITEMS OF RELIABILITY | CONDITIONS OF RELIABILITY | EXAMPLE | | | | COMPARATIVE EXAMPLE | | | | |
|---|---|---|---|---|---|---|---|---|---|---|
| | | 5 | 6 | 7 | 8 | 6 | 7 | 8 | 9 | 10 |
| TEMPERATURE CYCLE TEST | NO. OF DEFECTIVES AFTER 1000 CYCLES (−550°C ↔ 150°C) | 0/5 | 0/5 | 0/5 | 0/5 | 0/5 | 0/5 | 0/5 | 0/5 | 0/5 |
| HIGH-TEMPERATURE HIGH-HUMIDITY TEST | NO. OF DEFECTIVES AFTER 1000 HOURS AT 85°C, 85%RH | 0/5 | 0/5 | 0/5 | 0/5 | 1/5 | 1/5 | 1/5 | 0/5 | 2/5 |
| PCT TEST (AT 121°C, SATURATED VAPOR PRESSURE) | NO. OF DEFECTIVES AFTER 96 HOURS | 0/5 | 0/5 | 0/5 | 0/5 | 1/5 | 1/5 | 2/5 | 0/5 | 3/5 |

TABLE 4

| ITEMS OF RELIABILITY | CONDITIONS OF RELIABILITY | EXAMPLE | |
|---|---|---|---|
| | | 9 | 10 |
| TEMPERATURE CYCLE TEST | NO. OF DEFECTIVES AFTER 1000 CYCLES (−550°C ↔ 150°C) | 0/5 | 0/5 |
| HIGH-TEMPERATURE HIGH-HUMIDITY TEST | NO. OF DEFECTIVES AFTER 1000 HOURS AT 85°C, 85%RH | 0/5 | 0/5 |
| PCT TEST (AT 121°C, SATURATED VAPOR PRESSURE) | NO. OF DEFECTIVES AFTER 96 HOURS | 0/5 | 0/5 |
| | NO. OF DEFECTIVES AFTER 168 HOURS | 4/5 | 0/5 |

PACKAGING STRUCTURE AND METHOD FOR AUTOMOTIVE COMPONENTS

FIELD OF THE INVENTION

The present invention relates to a packaging structure and method, more particularly, to a packaging structure and method utilizing a thixotropic silicone gel.

DISCUSSION OF THE RELATED ART

Silicone gel is commonly used fur protection of electronic parts and connecting wires in automotive components, such as, engine control units and sensor units due to silicone gel's low elastic modulus and its ability to greatly reduce thermal stress resulting from differences among components coefficient of thermal expansion. Also, silicone gels have good heat resistance and are resistant to changes in physical properties in temperatures, particularly, from about −55 to 150° C. Further, silicone gels have low surface tension, good wettability and adhesion.

Figure 3:
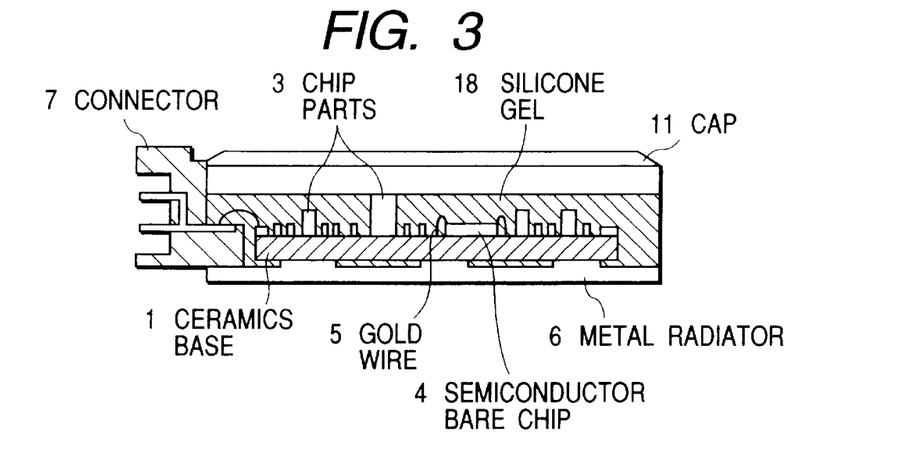
FIG. 3 is a sectional view showing the conventional packaging structure applied to an automotive engine control unit.

For instance, a conventional automotive engine control unit is schematically shown in FIG. 3. On ceramic base 1 are mounted chip parts 3 (such as capacitors and resistors) and a semiconductor bare chip 4. Then, they are connected to the surface conductor of the ceramic base by wire bonding 5 or soldering. The ceramic base is mounted on and bonded to a metal radiator 6 which is integral with a plastic or metal connector 7 as a casing.

For electrical communication, the connector's terminal leads are connected to pads on the ceramic base by means of wire bonding 5, soldering, or TAB (tape automated bonding). The assembly is coated with a silicone gel 18, which is subsequently heated, for the protection of electronic parts against moisture and foreign matter in the atmosphere. Finally, the casing is hermetically closed with a cap 11 by means of an adhesive or rubber O-ring.

Figure 4:
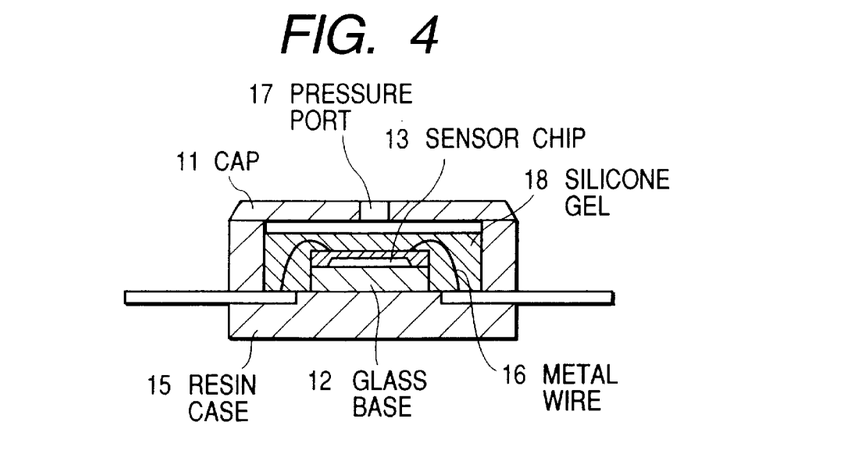
FIG. 4 is a sectional view showing the conventional packaging structure applied to an automotive sensor part.

A conventional automotive pressure sensor is schematically shown in FIG. 4. On a glass base 12 is mounted a sensor chip. They are hermetically bonded together in a vacuum by means of soldering or anodic process. The glass base 12 is bonded with an adhesive to the inner bottom of a resin casing 15 having external terminals. The sensor chip is connected to the external terminals through bonded metal wires 16. The surface of the sensor chip and metal wire is sealed with a silicone gel 18 which is poured into the resin casing 15. Resin casing 15 is bonded with an adhesive cap 11 having a pressure port 17. As in the case of automotive engine control unit of FIG. 3, the silicone gel 18 protects the sensor chip 13 and connecting metal wires 16 from the atmosphere.

However, silicone gels can be problematic. For instance, while a low-viscosity silicone gel permits efficient application to the surface of ceramic bases, it needs a frame or dam to prevent it from spreading out unnecessarily. Conventionally, the resin or metal casing functions as a frame or dam to prevent the silicone gel from spreading out. However, since the silicone gel does spread out, it is necessary to pour a large amount of it to cover the thick electronic parts mounted on the base. This changes the characteristic properties of the control unit or sensor and makes it necessary to remove the excess silicone gel. Moreover, the excess silicone gel can adversely affect the bonding of a cap, causing peeling and cracking.

However, a thixotropic silicone gel retains its shape after application to the surface of the ceramic base and seals only those parts to be sealed. But, a conventional thixotropic silicone gel rapidly increases in viscosity, causing deteriorating coatability and voids. Moreover, it has a poor ability to impregnate into narrow interstices between closely packed parts or wires.

SUMMARY OF THE INVENTION

The present invention provides a packaging applied to a highly reliable automotive component, such as, a engine control unit or sensor, having a thixotropic silicone gel superior in workability owing to its physical properties within a specific range.

An object of the present invention provides a packaging structure applied to an automotive component to regulate the engine and transmission, having semiconductors and electronic parts mounted on a ceramic base, characterized in that the semiconductors and electronic parts are partly or entirely sealed with a thixotropic silicone gel which has a thixotropy index of about 1.5–3.6 and a penetration depth of about 6–10 mm, and a rate of change in viscosity of no more than 10% of the initial value.

In a preferred embodiment, the above-mentioned thixotropic silicone gel should additionally have a viscosity of 1000–5000 mPa·s at 25° C., a light transmittance greater than 60%, an exothermic peak at 100–140° C., a one-pack form of uniform mixture and a rate of change in viscosity of no more than 10% of the initial value after 7 days at 40° C.

In the above-mentioned packaging structure for an automotive component, the ceramic base can be mounted on a heat radiating metal base, for instance, an aluminum base. Preferably, the thixotropic gel has a thickness of about 10–1000 μm. The packaging structure, from the bottom of the metal base to the top of the package structure is about 3–10 mm high.

Another object of the present invention provides a packaging method applied to an automotive component composed of a ceramic base and semiconductors and electronic parts mounted on said ceramic base, said method comprising coating said semiconductors and electronic parts partly or entirely with a thixotropic silicone of the present invention and heat-hardening the silicone gel layer covering said ceramic base, semiconductors, and electronic parts.

Another object of the present invention provides a packaging structure applied to an automotive component having semiconductors and electronic parts mounted on a ceramic base, said semiconductors and electronic parts being connected by a conductive line, preferably a metal wire, bonding to the external terminal leads of a connector, characterized in that the uppermost part of the terminal leads of the connector is equal to or shorter in height than the uppermost level of said ceramic base, and said semiconductors and electronic parts mounted on said ceramic base are sealed with a thixotropic silicone of the present invention.

Alternatively, the terminal leads of the connector are constructed in at least two tiers and the uppermost part of the terminal leads of the connector is equal to or shorter in height than the uppermost level of said ceramic base, and the semiconductors and electronic parts mounted on the ceramic base are sealed with a thixotropic silicone gel of the present invention.

In yet another embodiment of the present invention, the casing has a main lower surface which is a heat-radiating metal base and has an upper surface which has a ceramic base attached thereto, the ceramic base has an outer frame which supports semiconductors and electronic parts, the outer frame being 3–10 mm high from the bottom of the heat-radiating metal base, and the semiconductors and electronic parts mounted on the ceramic base are partly or entirely sealed with a thixotropic silicone gel of the present invention to a thickness of about 10–1000 μm.

BRIEF DESCRIPTION OF THE DRAWINGS

The above advantages and features of the invention will be more clearly understood from the following detailed description which is provided in connection with the accompanying drawings.

DETAILED DESCRIPTION OF THE INVENTION

Exemplary embodiments of the present invention will be described below in connection with the drawings. Other embodiments may be utilized and structural or logical changes may be made without departing from the spirit or scope of the present invention. Although exemplary process conditions for forming various material layers are described below, these are only representative and are not meant to be considered as limiting the invention. Further, although the invention is described in terms of an automobile component, namely, an automobile control unit and sensor, the invention is applicable to other packaging structures utilizing a silicone gel. Like items are referred to by the like reference numerals throughout the drawings.

Figure 1:
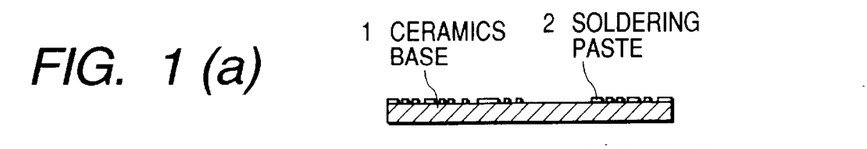
FIGS. 1(a) to 1(i) are diagrams showing the packaging structure and method applied to an automotive engine control unit according to the present invention.

Referring now to FIG. 1, a schematic diagram showing the steps of mounting various parts for an automotive engine control unit is described. In step (a), a ceramic base 1 is printed with a pattern of soldering paste 2. In step (b), the ceramic base 1 is loaded with chip parts 3 (such as chip resistor, ceramic capacitor, and aluminum capacitor) by means of an automated mounter. Then, the base is passed through a reflow soldering furnace at about 210–250° C., so that soldering is accomplished. In step (c), the base is cleaned to remove the flux and then dried at a prescribed temperature for a prescribed period of time. A specific area on the base is coated with a silver paste adhesive by using a dispenser, and a semiconductor bare chip 4 is mounted on that area. The silver paste adhesive is then cured at about 120–180° C. for about 0.5–2 hours. In this way, the semiconductor bare chip 3 is bonded to the base 1. In step (d), the ceramic base is electrically connected to the bare chip through gold wires 5 (25–30 μm in diameter) by ultrasonic-thermal compression bonding. In step (e), the ceramic base loaded with parts is bonded to a metal radiator 6 (such as aluminum) in the same way as mentioned above. In step (f), the metal radiator 6 is integrally bonded to a resin connector 7 with a silicone adhesive which is cured at about 120–150° C. for about 0.5–2 hours. The silicone adhesive relieves stress resulting from difference in the coefficient of expansion between the resin connector, radiator, and ceramic base. In step (g), the ceramic base is connected to the external terminals 8 of the resin connector through aluminum wires 9 (100–300 μm in diameter) by ultrasonic bonding at room temperature.

In step (h), all the electronic parts and aluminum wires 9 on the ceramic base are covered with the thixotropic silicone gel of the present invention. This step is carried out by using a dispenser attached to an XY robot. The silicone gel is hardened at about 120–150° C. for about 0.5–1 hour. The silicone gel used in the present invention has a thixotropy which permits it to retain its shape. It should preferably have a thixotropy index of 1.5–3.6, which is represented by a ratio of two values of apparent viscosity measured at 25° C. with a rotating viscometer at 6 rpm and 60 rpm. With a thixotropy index smaller than 1.5, the silicone gel does not retain its shape but spreads out. With a thixotropy index larger than 3.6, the silicone gel has such a high viscosity that it does not impregnate easily.

An effective way to impart thixotropy to the silicone gel is by filling with silica fine powder having an average particle diameter of about 10–40 nm and a specific surface area of about 50–400 m$^2$/g. The silica fine powder should preferably be one which has hydrophobic surface treatment. The silicone gel should preferably be filled with silica fine powder with hydrophobic surface treatment so that it has a thixotropy index of 1.5–3.6.

According to the present invention, the thixotropic silicone gel should preferably have a low hardness (after hardening) so that it does not impose an undue stress to the semiconductors, sensors, and electronic parts mounted on the ceramic base. Hardness is expressed in terms of the penetration depth (measured according to Japanese Industrial Standard K2220) which is a depth a ¼ conical needle reaches under a load of 9.38 g.

The silicone gel should preferably have a penetration depth of 6–10 mm (60–100 measurement value or degree of penetration according to JIS K 2220) so that it ensures the semiconductors, sensors, and electronic parts high reliability. With a penetration depth lower than 6 mm (60 measured value), the silicone gel will break solder joints and connecting wires in the heating cycle test and vibration test. With a penetration depth higher than 10 mm (100 measured value), the silicone gel does not impose rigidity when the control unit or sensor is vertically positioned.

According to the present invention, the silicone gel (in the form of a uniform mixture composed of principal ingredient, hardening agent, and hardening catalyst) should be stable such that its rate of change in viscosity is no more than 10% of its initial value after standing at 25° C. within 3 days. A silicone gel with a viscosity change in excess of 10% has to be renewed every day when it is left unused in the coating apparatus. In addition, such a silicone gel fluctuates in viscosity at the time of coating and is poor in coating performance and filling performance and is receptive to voids in the coating layer. Also, such a silicone gel continues to harden while it remains in the coating apparatus when not in operation. This necessitates additional maintenance work and poses problems with quality control and workability.

In a preferred embodiment, the thixotropic gel used in the present invention should have a viscosity of 1000–5000 mPa·s at 25° C. (measured with a rotating viscometer at 60 rpm), a light transmittance greater than 60% (measured after heat-hardening for a coating thickness of 2 mm), an exothermic peak at 100–140° C. when measured with a differential scanning calorimeter (DSC) at a programming rate of 5° C./min, a one-pack form of uniform mixture composed of principal ingredient, hardening agent, and hardening catalyst and a storage stability such that the silicone gel in the form of uniform mixture composed of principal ingredient, hardening agent, and hardening catalyst does not change in viscosity by more than 10% of the initial value after standing for 7 days at 40° C.

The thixotropic silicone gel of the present invention should preferably have a viscosity of 1000–5000 mPa·s (measured with a rota retains its shape and penetrates well and is free from voids after application. With a viscosity lower than 1000 mPa·s, the silicone gel will not exhibit the desired thixotropy. With a viscosity higher than 5000 mPa·s, the silicone gel will not easily penetrate into interstices between electronic parts mounted on the ceramic base, causing voids and leaving some electronic parts uncoated.

The thixotropic silicone gel of the present invention should preferably be transparent so that it permits one to visually check bare chips and electronic parts for voids and penetration after its application and hardening. To be more specific, the silicone gel should have a light transmittance of no less than 60% (for a 2-mm thick sample). Therefore, any sample having a light transmittance of less than 60% makes it difficult to visually check for minute voids which may exist, for instance, behind the gold wires of the coated bare chips.

The thixotropic silicone gel of the present invention should harden completely within several hours at a temperature no higher than 150° C. in view of the fact that those electronic parts (particularly capacitors) constituting the automotive engine control unit or sensor are poor in heat resistance. In fact, the electronic parts as a whole can only endure heating at a limited temperature no higher than 170° C. (desirably 150° C.) for a limited period of time (several hours). Hence, the silicone gel of the present invention has an exothermic peak at 100–140° C. when measured with a differential scanning calorimeter (DSC) at a programming rate of 5° C./min. With an exothermic peak exceeding 140° C., the silicone gel does not harden completely at the above-mentioned hardening temperature (not higher than 150° C.). Incompletely hardened silicone gel fluctuates in characteristic properties. With an exothermic peak lower than 100° C., the silicone gel is extremely poor in storage stability or shelf life.

According to the present invention, the silicone gel is used in the form of a uniform mixture composed of a principal ingredient (silicone gel), hardening agent, and hardening catalyst so that it will resist fluctuations in characteristic properties when its composition changes. The silicone gel in the form of a uniform mixture should have a storage stability such that its rate of change in viscosity is no more than 10% when stored at 25° C. for 3 days or more. This storage stability is necessary for easy handling. Moreover, the silicone gel used in one-pack type should have a storage stability such that its rate of change in viscosity is no more than 10% when stored at 25° C. for 7 days or more.

The thixotropic silicone gel has both the hardening properties and the storage stability as mentioned above when it is incorporated with the hardening catalyst in combination with an adequate amount of a hardening retarder. The silicone gel of the present invention should preferably be of the heat-addition type which hardens with a platinum catalyst. This platinum catalyst should be used in combination with a retarder which prevents the coordination to the platinum catalyst of the unreacted double bond of the silicone gel at a room temperature of about 50° C., thereby reducing the activity of the platinum catalyst, but not preventing the addition (hydroxylating reaction) of hydrogen to the double bond on account of the catalytic activity at a temperature higher than about 100° C.

The thixotropic silicone gel of the present invention may have the following composition. Organopolysiloxane (such as dimethylpolysiloxane and dimethylphenylpolysiloxane) as the principal ingredient. Organohydrogenpolysiloxane (such as methylhydrogenpolysiloxane) as the hardening agent. Platinum catalyst as the hardening catalyst. Nitrogen-containing compound, phosphorous compound, or unsaturated alcohol as the retarder. Silica fine powder (such as methylated aerosil) as the thixotropic agent.

The hardening of the silicone gel takes place mainly through the addition reaction (hydrosilylating reaction) between the vinyl group-containing siloxane and the Si—H group-containing siloxane. If the principal ingredient is dimethylphenylpolysiloxane, the resulting silicone gel is superior in cold resistance. The catalyst and retarder should be properly selected in view of the relation between the reactivity and the storage stability of the silicone gel. In addition, the amount of the silica fine powder should be selected so that the silicone gel has the thixotropy index specified in the present invention.

Referring again to FIG. 1, in final step (i), the resin connector is closed with a cap 11 which is bonded with an epoxy or silicone adhesive applied to that part of the resin connector to which the cap is fitted. The adhesive is subsequently heated for curing. In this way there is obtained the automotive engine control unit according to the present invention. The finished unit is loaded with a program and tested for electrical properties and performance.

The automotive engine control unit of the present invention should have an aluminum wire 9 (conductive line) which is coated with the thixotropic silicone gel as described above, with reference to FIG. 1(h). However, a large part of the aluminum wire stands out from the silicone gel if the uppermost part of the lead of the external terminal 8 of the connector is arranged at a position above the top of the ceramic base. Under this situation, the aluminum wire is coated with a thin film of the thixotropic silicone gel and has a satisfactory moisture resistance at 85° C. and 85% RH. However, its moisture resistance is limited at 120° C. and 100% RH.

Figure 5:
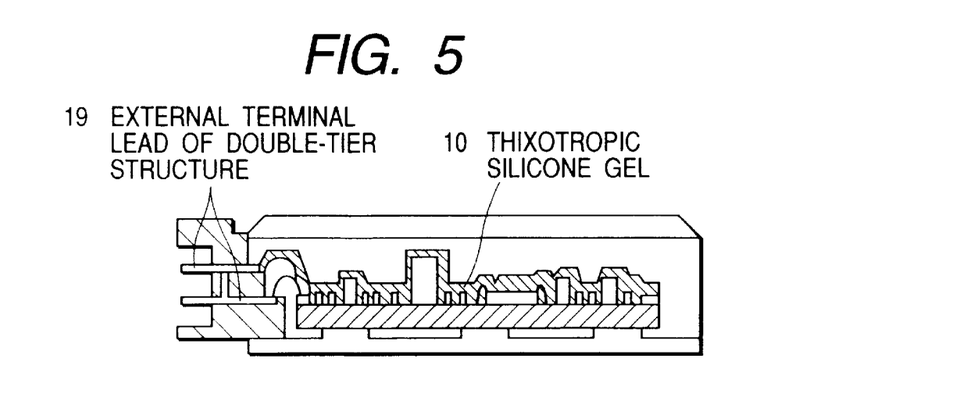
FIG. 5 is a sectional view showing the packaging structure applied to an automotive engine control unit in Example 9.

The control unit may have the external terminals 19 arranged in two or more tiers for connection to the multiple pins of the connector, as shown in FIG. 5. The control unit of this structure presents difficulties in coating the aluminum wire 9 connected to the lower tier of the lead of the external terminal 8 entirely with the silicone gel 10.

Figure 6:
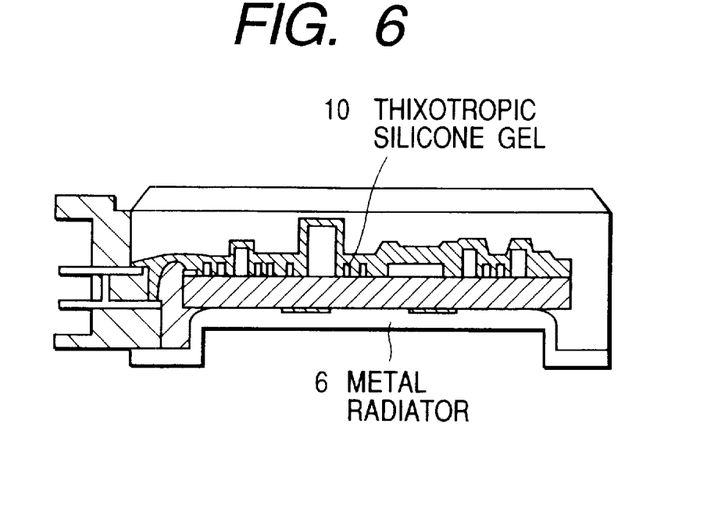
FIG. 6 is a sectional view showing the packaging structure applied to an automotive engine control unit in Example 10.

The aluminum wire 9 connected to the upper tier of the external terminal lead 8 prevents the silicone gel 10 from reaching the aluminum wire 9 connected to the lower tier of the external terminal lead 8. This difficulty can be eliminated if the uppermost part of the external terminal lead 8 of the connector 7 is arranged at a height equal to or lower than the ceramic base, as shown in FIG. 6. This structure permits the silicone gel 10 to cover the aluminum wire 9 connected to the lower tier of the external terminal lead 8.

The above-mentioned arrangement may be accomplished if the metal radiator 6 is shaped by cutting or press forming such that the part on which the ceramic base 1 is mounted is raised. Alternatively, it is also possible to change the arrangement of the external terminals 8 of the connector. The modified structure ensures good reliability to resistance against moisture contamination.

Referring now to FIG. 2, the steps of mounting an automobile pressure sensor are described. In step (a), a sensor chip 13 is placed on a glass base 12, with a diaphragm 14 facing downward. They are hermetically bonded together by anodic bonding or soldering in a vacuum. In step (b), the resulting assembly is bonded to a resin case 15 with a silicone adhesive or epoxy adhesive. The resin case 15 has external terminals 8 such as a lead frame. In step (c), the adhesive is cured at about 100–150° C. for about 0.5–2 hours. The sensor chip 13 is connected to the external terminals 8 through gold or aluminum wires 16 by ultrasonic-thermal compression bonding or ultrasonic bonding at room temperature. In step (d), the thixotropic silicone gel 10 of the present invention is applied over the glass base 12, sensor chip 13, and metal wire 16. Next, the silicone gel 10 is hardened by heat curing. In final step (e), the resin case 15 is closed with a cap 11 having a pressure port 17. They are bonded together with a silicone adhesive or epoxy adhesive.

The invention will be described in more detail with reference to the following examples.

EXAMPLE 1

The steps shown in FIG. 1 are carried out as follows.

In step (a), a multiplayer ceramic base 1 measuring 60×65 mm is printed with an Sn/Ag soldering paste 2.

In step (b), the ceramic base 1 is loaded with chip parts 3 (such as chip resistors, ceramic capacitors, and aluminum capacitors) by means of an automated mounter. The ceramic base 1 is passed through a reflowing furnace (at a maximum temperature of about 235° C.) for connection of chip parts 3.

In step (c), the ceramic base 1 is cleaned with a hydrocarbon based solvent to remove flux and then dried at a prescribed temperature for a prescribed period of time. The ceramic base 1 is loaded with a semiconductor bare chip 4, which is bonded to a specified part by means of an Ag paste adhesive which is applied by a dispenser. Bonding with the Ag paste adhesive is completed by heating at about 150° C. for about 1 hour.

In step (d), the bare chip 4 is electrically connected to the ceramic base 1 with a conductive line, for instance, gold wires 5 (30 $\mu$m in diameter) by ultrasonic-thermal compression bonding.

In step (e), the ceramic base 1 loaded with parts 3 is placed on a radiator 6 made of a metal, such as, aluminum and are bonded together by heat-curing.

In step (f), the metal radiator 6 is integrally bonded to a resin connector 7 with a silicone adhesive which is heated at about 140° C. for about 30 minutes.

In step (g), the ceramic base 1 is connected to the external terminals 8 of the resin connector 7 with aluminum wires 9 (300 $\mu$m in diameter) by ultrasonic bonding at room temperature.

In step (h), all the electronic parts and aluminum wires 9 on the ceramic base are covered with about 10 g of the thixotropic silicone gel (A) of the present invention which has the characteristic properties as shown in Table 1. This step is carried out by using a dispenser attached to an XY robot. The silicone gel is hardened at about 140° C. for about 30 minutes.

In final step (i), the resin connector is closed with a cap 11, which is bonded with an epoxy adhesive by heating at about 140° C. for about 1 hour.

The characteristic properties of the sample of Example 1 are shown in Table 1 and were measured as described below.

Thixotropy index: expressed in terms of the ratio of $\eta(6 \text{ rpm})/\eta(60 \text{ rpm})$, where $\eta(6 \text{ rpm})$ and $\eta(60 \text{ rpm})$ represent the viscosities measured by using a Brookfield rotating viscometer at a rotor speed of 6 rpm and 60 rpm, respectively.

Viscosity: measured at 25° C. by using a Brookfield rotating viscometer at a rotor steed of 60 rpm.

Clarity: A sample of silicone gel is poured into a transparent glass cell (2 mm in thickness), and the filled glass cell is allowed to stand at room temperature until any bubbles disappear. The sample is then measured for light transmittance by using a recording spectrophotometer. The sample is also visually examined for clarity.

Differential scanning calorimetry (DSC): A sample of about 10–20 mg is heated to 200° C. at a programming rate of 5° C./min and the exothermic peak temperature, due to hardening, is obtained.

Storage stability: A sample of silicone gel (not yet hardened) is allowed to stand at 25° C. or 40° C. for a prescribed period of time, and the sample is then measured for viscosity. Storage stability is expressed in terms of time required for the sample to change in viscosity by more than 10% from its initial viscosity after 3 days.

Penetration depth (as a measure of the hardness of silicone gel): Measured according to Japanese Industrial Standard K2220. Expressed in terms of a depth a ¼ conical needle reaches under a load of 9.38 g.

The automotive engine control unit obtained in the above-mentioned manner was evaluated in terms of the workability of the thixotropic silicone gel (A), the appearance of the silicone gel after hardening, and the durability and reliability. The results are shown in Table 2 below. The reliability is expressed by a fraction, the denominator denoting the number of samples tested and the numerator denoting the number of defective samples found after a durability test. "Defective" means incomplete continuity, increased resistance and large electrical noises.

EXAMPLES 2 TO 4

Samples of thixotropic silicone gel (B) to (D) shown in Table 1 were used to produce the automotive engine control unit in the same way as in Example 1.

The automotive engine control unit obtained was evaluated in terms of the workability of the thixotropic silicone gel (B) to (D), the appearance of the silicone gel after hardening, and the durability and reliability. The results are shown in Table 2 above.

Comparative Examples 1 to 5

Samples of thixotropic silicone gel (E) to (I) shown in Table 1 were used to produce the automotive engine control unit in the same way as in Example 1.

The automotive engine control unit obtained was evaluated in terms of the workability of the thixotropic silicone gel (E) to (I), the appearance of the silicone gel after hardening, and the durability and reliability. The results are shown in Table 2 above.

It is noted from Table 2 that the automotive engine control units in Examples are superior to those in Comparative Examples in coating performance (workability and appearance after hardening) and reliability (temperature cycle test, high-temperature high-humidity test, and PCT test). Example 4 requires a step of uniformly mixing the thixotropic silicone gel of two-pack type at the time of coating.

In comparision, Comparative Example 1 shows that the silicone gel having a high thixotropy index as well as a high viscosity is poor in impregnating performance and causes a large number voids therein. Voids are found in the vicinities of soldered chip and semiconductor bare chip and in the interstice between the semiconductor bare chip and its metal wire.

Figure 7:
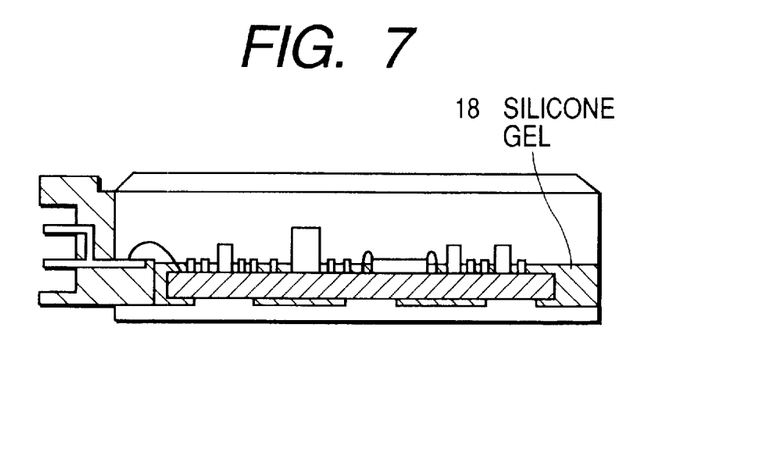
FIG. 7 is a sectional view showing the packaging structure applied to an automotive engine control unit in Comparative Examples 2 and 3.

Comparative Examples 2 and 3 show that the silicone gel with insufficient thixotropy flows to the edge of the casing, allowing the semiconductor bare chip and its metal wire to stand out, as shown in FIG. 7. This leads to poor moisture resistance.

Comparative Example 4 shows that the silicone gel has poor storage stability after mixing which causes minute voids. These minute voids exert little influence on reliability in test at 85° C. and 85% RH but adversely affect moisture resistance under high stress in PCT test.

Also, Comparative Example 5 shows that the silicone gel having a slightly high viscosity poses the same problem as in Comparative Example 1. Due to high hardness, the silicone gel produces a sample which is extremely poor in temperature cycle reliability and moisture resistance.

EXAMPLE 5

This example demonstrates a semiconductor sensor which is produced by the steps shown in FIG. 2.

Figure 2A:
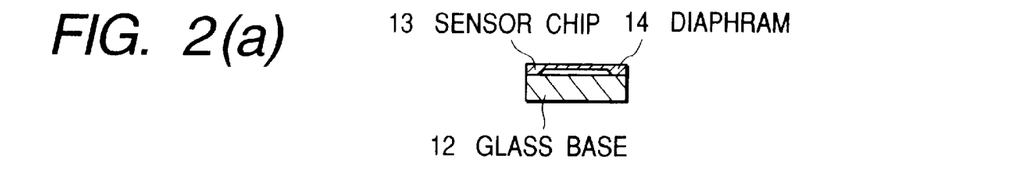
FIGS. 2(a) to 2(e) are diagrams showing the packaging structure and method applied to an automotive sensor part according to the present invention.

In step (a), a glass base 12 is loaded with a sensor chip 13, with its diaphragm 14 downward. They are hermetically bonded together in a vacuum by anodic bonding under the following condition.

Bonding temperature: 450° C.

Voltage applied: 400V

Duration of voltage application: 300 seconds

Figure 2B:
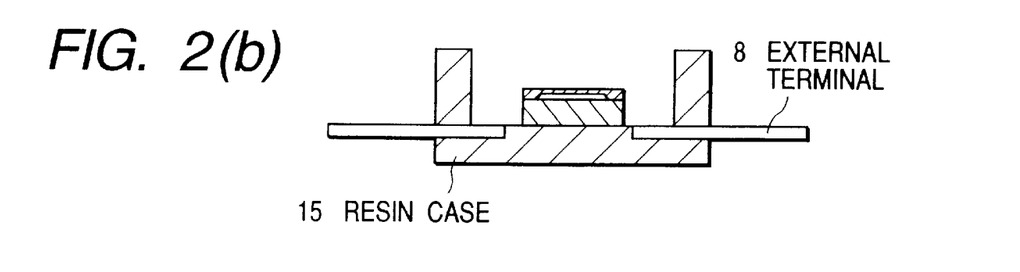

In step (b), the glass base 12 is bonded with a silicone adhesive to a resin casing 15 which has an opening measuring 12×13 mm and external terminals 8 (such as lead frame). The silicone adhesive is cured at 140° C. for about 30 minutes.

Figure 2C:
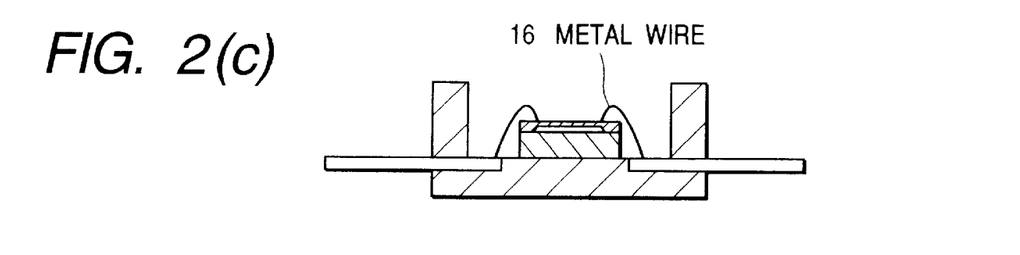

In step (c), the sensor chip 13 is connected to the external terminals 8 through metal wires 16 by ultrasonic-thermal compression bonding.

Figure 2D:
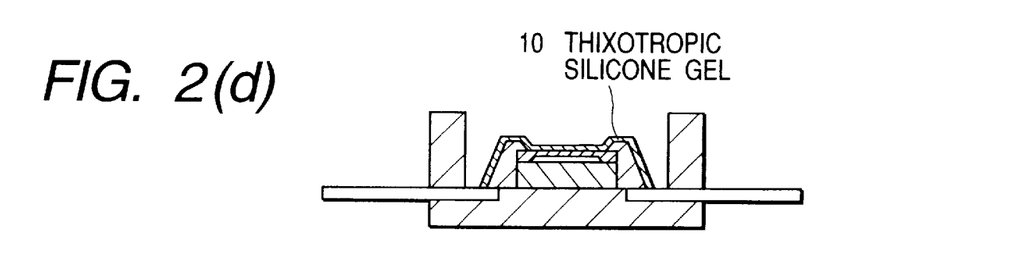

In step (d), the glass base 12, the sensor chip 13 and the metal wire 16 are covered with 1 g of the thixotropic silicone gel (A) shown in Table 1. The silicone gel is hardened at 140° C. for about 30 minutes.

Figure 2E:
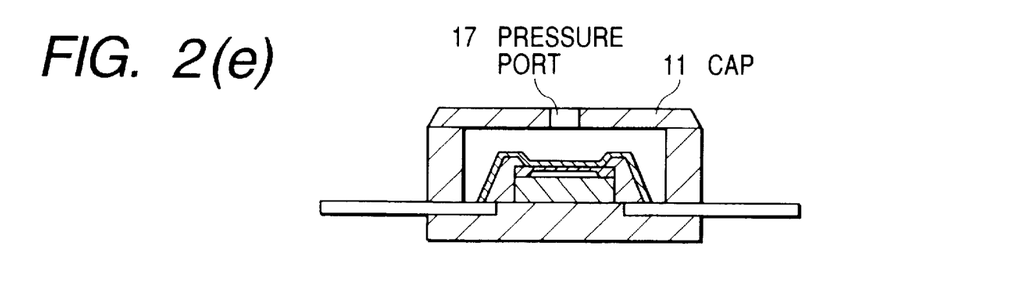

In step (e), the resin casing 15 is closed with a cap 11 having a pressure port 17 by bonding with an epoxy adhesive. Finally, the assembly undergoes pressure and electrical tests for analysis.

EXAMPLES 6 TO 8

Samples of thixotropic silicone gel (B) to (D) shown in Table 1 were used to produce the automotive semiconductor pressure sensor in the same way as in Example 5.

The automotive semiconductor pressure sensor obtained was evaluated to see how its durability and reliability depends on the thixotropic silicone gel (B) to (D) used. The results are shown in Table 3 below. The reliability in Table 3 is expressed by a fraction, the denominator denoting the number of samples tested and the numerator denoting the number of defective samples found after durability test. "Defective" means incomplete continuity, increased resistance, large electrical noises, and non-linear errors larger than 10% in pressure application.

Comparative Examples 6 to 10

Samples of thixotropic silicone gel (E) to (I) shown in Table 1 were used to produce the automotive semiconductor pressure sensor in the same way as in Example 5.

The thus obtained automotive semiconductor pressure sensor was evaluated to see how its durability and reliability depends on the thixotropic silicone gel (E) to (I) used. The results are shown in Table 3.

It is noted from Table 3 that the automotive sensor part according to the present invention has comparable reliability as the automotive engine control unit, as shown in Table 2. Samples in Comparative Examples 6–10 are poor in durability and reliability because the silicone gel used in them has physical properties outside the range specified in the present invention. Poor durability and reliability are associated with the coating performance of the silicone gel used and the appearance of the hardened silicone gel which are caused by incomplete impregnation and voids.

Figure 8:
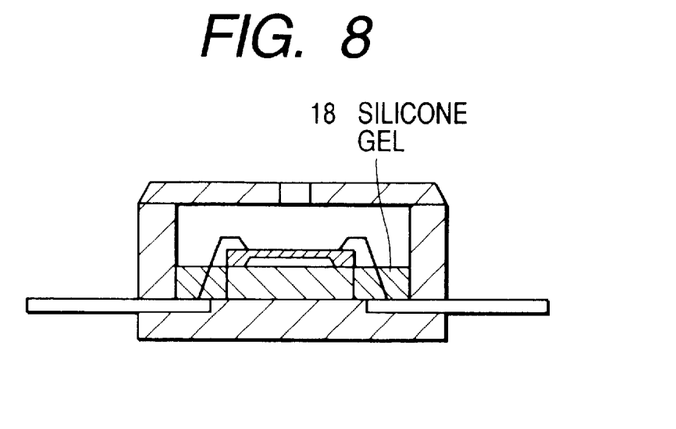
FIG. 8 is a sectional view showing the packaging structure applied to an automotive sensor part in Comparative Examples 7 and 8.
Figure 9:
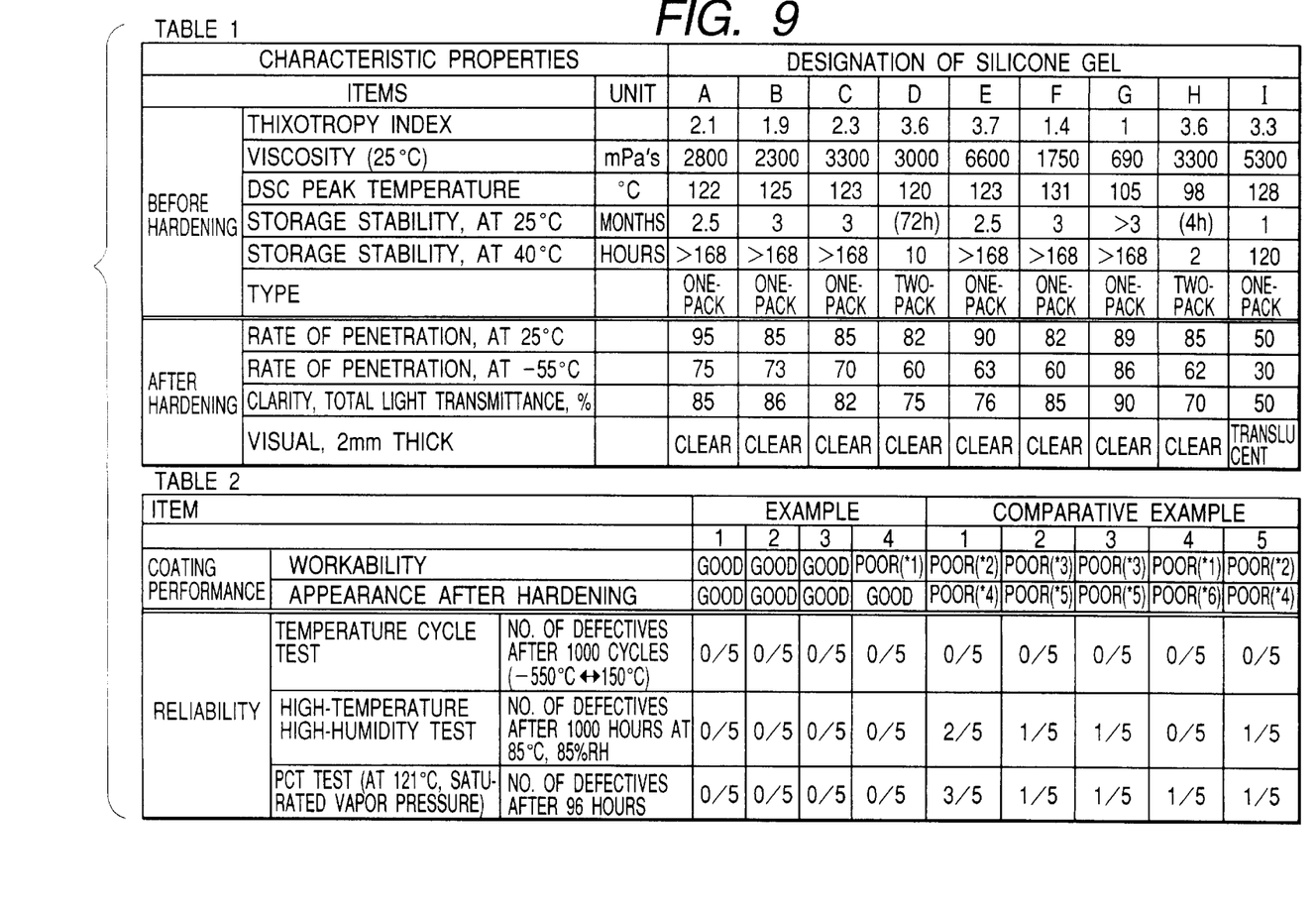
FIG. 9 illustrates Tables 1 and 2 showing the characteristic properties of the samples of Examples 1 to 4.
Figure 10:
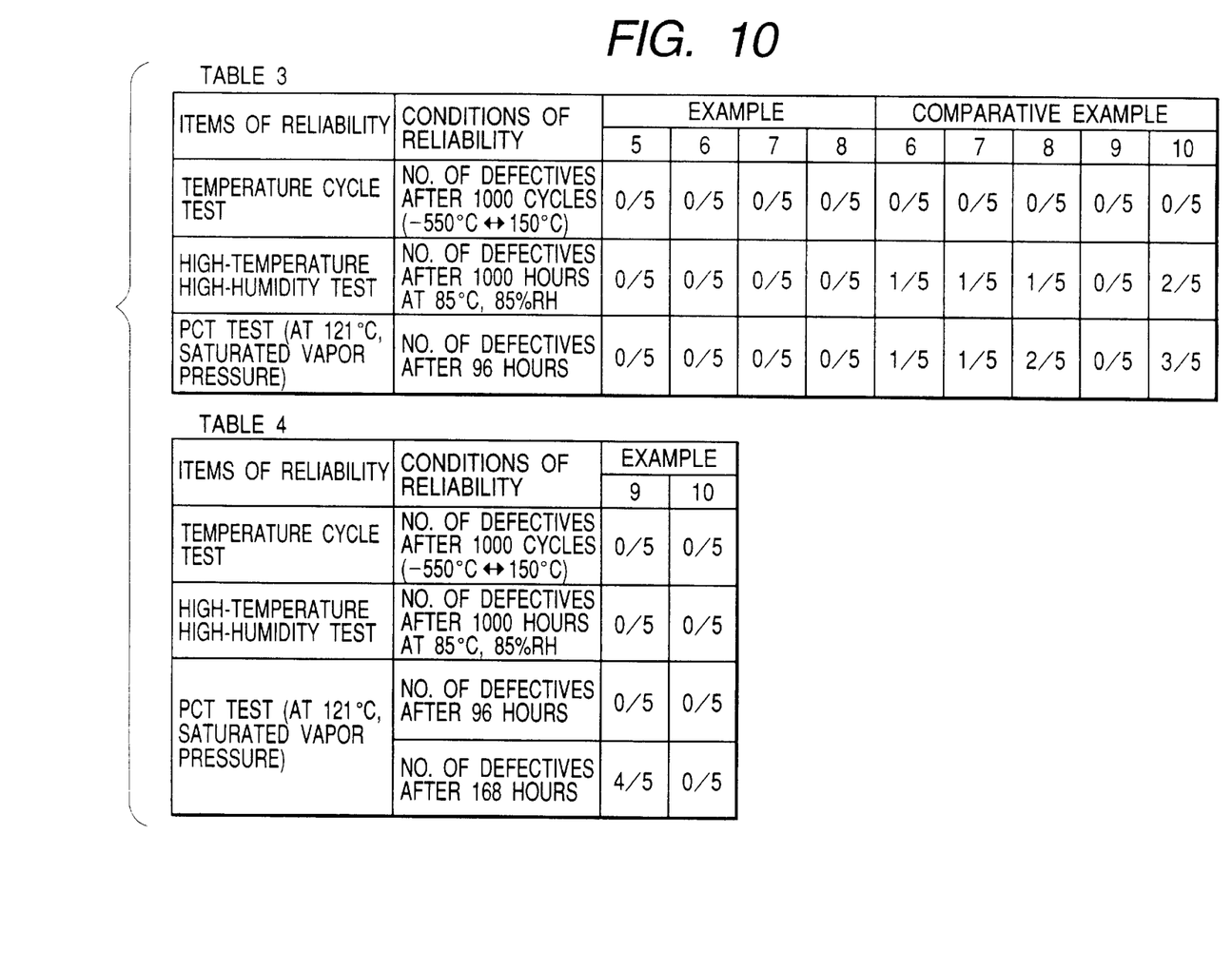
FIG. 10 illustrates Tables 1 and 2 showing the characteristic properties of the samples of Examples 6 to 9.

The samples in Comparative Examples 7 and 8 are defective, with the metal wire on the sensor chip standing out as shown in FIG. 8. The sample in Comparative Example 9 is comparable in durability and reliability with the sample in Examples. However, it is thought that reliability was affected little by the viscosity increase resulting from poor storage stability, because the sensor part is composed of a small number of electronic parts.

EXAMPLE 9

The same procedure as in Example 1 was repeated to produce the automotive engine control unit, except that the resin connector has external terminal leads 19 arranged in two tiers such that the lower terminal lead is higher than the top of the ceramic base loaded with electronic parts, as shown in FIG. 5. The thixotropic silicone gel (A) shown in Table 1 was used (about 10 g). The automotive engine control unit obtained was tested for durability and reliability. The results are shown in Table 4 below.

EXAMPLE 10

The same procedure as in Example 1 was repeated to produce the automotive engine control unit, except that the resin connector has external terminal leads arranged in two tiers such that the upper terminal lead is as high as the top of the ceramic base loaded with electronic parts and the ceramic base is supported on a raised part of a press-formed aluminum radiator, as shown in FIG. 6. The thixotropic silicone gel (A) shown in Table 1 was used (about 10 g). The automotive engine control unit obtained was tested for durability and reliability. The results are shown in Table 4 above.

It is noted from Table 4 that the sample in Example 10 is superior in reliability (by PCT test) to the sample in Example 9. The fact that the sample in Example 9 became defective (after PCT test for 168 hours) is due to corrosion on the aluminum wire. Excess corrosion was noticed on part of the lower aluminum wire. In some cases, the corrosion broke the aluminum wire. Example 10 employs the structure shown in FIG. 6 so that the lower wire is uniformly coated with the silicone gel. This structure contributes to improved moisture resistance.

Also, the automotive engine control unit or the automotive sensor part to regulate the engine and transmission is enclosed in a casing. The casing has a bottom which is a radiating metal plate. To the upper surface of the radiating metal plate is bonded the ceramic base. The casing has a frame which supports the semiconductors and electronic parts mounted on the ceramic base. The outer or top frame is 3–10 mm high from the bottom of the radiating metal plate. The semiconductors and electronic parts mounted on the ceramic base are partly or entirely sealed with the thixotropic silicone gel. The sealing layer, which is measured from the top of the ceramic base to the top of the gel, is 10–1000 $\mu$m thick.

Hence, the packaging structure according to the present invention makes it possible to enclose the automotive engine control unit or sensor in a casing which is small and thin in size and needs a lesser amount of material than in the prior art. The present invention provides a casing of the automotive engine control unit or the automotive sensor part to regulate the engine and transmission having a radiating metal plate as its bottom, said radiating metal plate having a ceramic base bonded to its upper surface. The casing has a frame to support semiconductor and electronic parts mounted on the ceramic base. The topmost part of the frame being 3–10 mm high from the bottom of the radiating metal plate, and the semiconductor and electronic parts mounted on the ceramic base are partly or entirely sealed with a thixotropic silicone gel such that the sealing layer, measured from the top of the ceramic base to the top of the gel, is about 10–1000 $\mu$m thick.

The present invention also provides a method of fabricating a package structure for an automotive engine control unit or the automotive sensor part to regulate the engine and transmission. The casing has a radiating metal plate as its bottom having a ceramic base bonded to its upper surface. The casing also has a frame to support semiconductor and electronic parts mounted on the ceramic base. The topmost part of the frame is 3–10 mm high from the bottom of the radiating metal plate. The semiconductor and electronic parts mounted on the ceramic base are partly or entirely sealed with the thixotropic silicone gel of the present invention.

The thixotropic silicone gel of the present invention has a thixotropy index and viscosity in the specific range mentioned above so that it has both a low viscosity and an ability to keep its shape. Due to these characteristic properties, the silicone gel seals electronic parts and bonding wires (and vicinities thereof) with its minimum amount applied to them, with the coating layer or sealing layer completely impregnating into narrow interstices without causing voids.

The thixotropic silicone gel of the present invention has a penetration depth (after heat-hardening) in the specific range mentioned above so that it forms a coating layer or sealing layer which does not break the bonding wire owing to its low stress over a broad range of temperature.

The thixotropic silicone gel of the present invention has an exothermic peak temperature (as a measure of change with time in gel viscosity and hardening characteristics) in the specific range mentioned above so that it has good storage stability as well as good hardening properties, the former contributing to the workability and the latter protecting electronic parts from thermal stress due to heating.

The thixotropic silicone gel of the present invention has a specific light transmittance (after hardening) as mentioned above, so that it facilitates visual inspection of electronic parts after coating. Sealing with a minimum amount of silicone gel having the above-mentioned characteristic properties imparts high reliability to semiconductor chips, sensors, and electronic parts in the automotive engine control unit or sensor.

Although the invention has been described above in connection with exemplary embodiments, it is apparent that many modifications and substitutions can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A package structure comprising:
    a ceramic base having a top surface;
    an electronic component mounted on said top surface;
    a thixotropic silicone gel overlying said component;
    said component being connected by a conductive line to external terminal leads of a connector; and
    said gel having a thixotropy index of about 1.5–3.6, a penetration depth of about 6–10 mm, a viscosity of 1000–5000 mPa·s at 25° C., a light transmittance greater than 60%, an exothermic peak at 100–140° C., a one-pack form of uniform mixture, and a rate of change in viscosity of no more than 10% of the initial value after standing for 7 days at 40° C.

2. The package structure of claim 1 wherein the ceramic base is mounted on a metal radiator.

3. The package structure of claim 2 wherein said metal is aluminum.

4. The package structure of claim 1 wherein said top surface of said ceramic base to a top surface of said thixotropic silicone gel is about 10–1000 $\mu$m thick.

5. The package structure of claim 1 wherein said package structure is about 3–10 mm high.

6. The package structure of claim 1 wherein said electronic component is an automotive component.

7. The package structure of claim 6 wherein said automotive component is an automotive engine control unit.

8. The package structure of claim 6 wherein said automotive component is an automotive engine sensor.

9. The package structure of claim 1 wherein an uppermost part of the terminal leads of the connector is equal to or shorter in height than said top surface of said ceramic.

10. The package structure of claim 1 wherein the terminal leads of the connector have at least two tiers and an uppermost part of the terminal leads of the connector is equal or shorter in height than said top surface of said ceramic base.

11. The package structure of claim 1 wherein said conductive line is a metal wire.

12. A package structure comprising:
    a ceramic base and a thixotropic silicone gel overlying said base,
    said gel having a thixotropy index of about 1.5–3.6, a penetration depth of about 6–10 mm and a rate of change in viscosity of no more than 10% of the initial value.

13. A method of fabricating a package structure comprising the steps of:

providing a ceramic base having a top surface;

mounting an electronic component on said top surface;

providing a thixotropic silicone gel over said components;

connecting said components by a conductive line to external terminal leads of a connector;

said gel having a thixotropy index of about 1.5–3.6, a penetration depth of about 6–10 mm, and a rate of change in viscosity of no more than 10% of the initial value; and heat-hardening said gel.

14. The method of claim 13 wherein said gel further comprises:
 a viscosity of 1000–5000 mPa·s at 25° C.;
 a light transmittance greater than 60%;
 an exothermic peak at 100–140° C.;
 a one-pack form of uniform mixture; and
 a rate of change in viscosity of less than 10% of the initial value after standing for 7 days at 40° C.

* * * * *